(12) United States Patent
Kim et al.

(10) Patent No.: US 10,031,390 B2
(45) Date of Patent: Jul. 24, 2018

(54) DISPLAY DEVICE INCLUDING PARASITIC CAPACITANCE ELECTRODES

(71) Applicant: Samsung Display Co., Ltd., Yongin-si (KR)

(72) Inventors: Ji Sun Kim, Yongin-si (KR); Jong Hee Kim, Yongin-si (KR); Young Wan Seo, Yongin-si (KR); Jae Keun Lim, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 145 days.

(21) Appl. No.: 14/997,817

(22) Filed: Jan. 18, 2016

(65) Prior Publication Data

US 2016/0291368 A1  Oct. 6, 2016

(30) Foreign Application Priority Data

Apr. 3, 2015  (KR) ........................ 10-2015-0047677

(51) Int. Cl.
*G02F 1/1343* (2006.01)
*G02F 1/1362* (2006.01)
*H01L 27/12* (2006.01)

(52) U.S. Cl.
CPC ...... *G02F 1/136286* (2013.01); *G02F 1/1343* (2013.01); *H01L 27/124* (2013.01); *H01L 27/1255* (2013.01)

(58) Field of Classification Search
CPC .... G02F 1/1343; G02F 1/1362; G02F 1/1368; G02F 1/133707; G02F 1/1393; G02F 1/136213; G02F 1/13439; G02F 2001/134354; G02F 1/134363; G02F 2001/136272; G02F 2201/123; H01L 27/1255; H01L 27/1214; H01L 27/3218; H01L 27/326

See application file for complete search history.

(56) References Cited

U.S. PATENT DOCUMENTS 5,822,027 A * 10/1998 Shimada ........... G02F 1/136213
                                                    349/144
7,507,992 B2  3/2009 Kim et al.
(Continued)

FOREIGN PATENT DOCUMENTS

KR  10-2007-0000610   1/2007
KR  10-2014-0089177   7/2014
KR  10-2014-0144593   12/2014

*Primary Examiner* — Huyen Ngo
(74) *Attorney, Agent, or Firm* — H.C. Park & Associates, PLC

(57) ABSTRACT

A display device including a first base substrate, gate lines disposed on the first base substrate and extending in a first direction, parasitic capacitance electrodes coupled to the gate lines, data lines extending in a second direction crossing the first direction, transistors, each coupled to one of the gate lines and coupled to one of the data lines, and pixels sequentially arranged in the first direction, each of the pixels coupled to a corresponding one of the transistors, respectively, in which each of the transistors includes a gate electrode, a source electrode, and a drain electrode, and wherein widths of the parasitic capacitance electrodes in adjacent pixels measured along the first direction are different from each other.

20 Claims, 7 Drawing Sheets

(56) References Cited

U.S. PATENT DOCUMENTS

| | | | |
|---|---|---|---|
| 7,834,949 B2* | 11/2010 | Tasaka | H01L 27/1255 349/143 |
| 8,766,950 B1* | 7/2014 | Morein | G06F 3/0416 345/173 |
| 2002/0105614 A1* | 8/2002 | Nakayama | G02F 1/136213 349/143 |
| 2007/0002229 A1 | 1/2007 | Lee et al. | |
| 2008/0231620 A1 | 9/2008 | Hector et al. | |
| 2011/0102692 A1* | 5/2011 | Shih | G06F 3/0412 349/38 |
| 2013/0083263 A1 | 4/2013 | Kim et al. | |
| 2013/0300641 A1 | 11/2013 | Kim | |
| 2014/0191238 A1* | 7/2014 | Hwang | H01L 27/1214 257/59 |
| 2014/0362322 A1* | 12/2014 | Park | G02F 1/136286 349/46 |
| 2017/0125533 A1* | 5/2017 | Kotani | H01L 23/36 |

* cited by examiner

DISPLAY DEVICE INCLUDING PARASITIC CAPACITANCE ELECTRODES

CROSS-REFERENCE TO RELATED APPLICATION

This application claims priority from and the benefit of Korean Patent Application No. 10-2015-0047677, filed on Apr. 3, 2015, which is hereby incorporated by reference for all purposes as if fully set forth herein.

BACKGROUND

Field

Exemplary embodiments relate to a display device. More particularly, exemplary embodiments relate to a display device with improved display qualities.

Discussion of the Background

A liquid crystal display device may include a liquid crystal layer injected between upper and lower substrates where transparent electrodes are formed. Further, upper and lower polarizing plates may be disposed on outer sides of the upper and lower substrates and a penetration ratio of the light that passes through the liquid crystal layer may be adjusted according to a change in the arrangement of the liquid crystal molecules between the upper and lower substrates.

The display device may include a color filter to display the three primary colors i.e., red, green, and blue, to implement an image based on the control of the three primary colors. However, depending on the penetration ratio of each of red, green, and blue pixels, the color coordinate of the display device may change. Accordingly, in order to obtain a desired color coordinate, the areas of the red, green, and blue color filters or pixel electrode formed based on a pixel unit basis in a display device may be manufactured according to a desired area ratio.

The above information disclosed in this Background section is only for enhancement of understanding of the background of the inventive concept, and, therefore, it may contain information that does not form the prior art that is already known in this country to a person of ordinary skill in the art.

SUMMARY

Exemplary embodiments provide a display device including pixels having various areas yet having uniform display quality per pixel.

Additional aspects will be set forth in the detailed description which follows, and, in part, will be apparent from the disclosure, or may be learned by practice of the inventive concept.

An exemplary embodiment discloses a display device including: a first base substrate; gate lines disposed on the first base substrate, the gate lines extending in a first direction; parasitic capacitance electrodes coupled to the gate lines; data lines extending in a second direction crossing the first direction; transistors, each coupled to one of the gate lines and coupled to one of the data lines; and pixels sequentially arranged in the first direction, each of the pixels coupled to a corresponding one of the transistors, respectively. Each of the transistors includes a gate electrode, a source electrode, and a drain electrode, and at least two drain electrodes among the drain electrodes of the transistors each overlap a corresponding one of the parasitic capacitance electrodes in different areas as viewed from a plan view.

An exemplary embodiment also discloses a display device including: a first base substrate; gate lines disposed on the first base substrate, the gate lines extending in a first direction; parasitic capacitance electrodes protruding from the gate lines; data lines extending in a second direction crossing the first direction; a first and second transistors, each of the first transistor and the second transistor is coupled to one of the gate lines and one of the data lines; and a first and second pixels sequentially arranged in the first direction, the first pixel being coupled to the first transistor and the second pixel being coupled to the second transistor. Each of the first transistor and the second transistor includes a gate electrode, a source electrode, and a drain electrode, and the drain electrodes of the first and second transistors overlap a corresponding one of the parasitic capacitance electrodes in different areas as viewed from a plan view.

An exemplary embodiment further discloses a display device including: a first base substrate; a gate line disposed on the first base substrate, the gate lines extending in a first direction; a first parasitic capacitance electrode and a second parasitic capacitance coupled to the gate line; a first data line and a second data line extending in a second direction crossing the first direction; and a first transistor corresponding to a first pixel of a pixel group, and a second transistor corresponding to a second pixel of the pixel group, the first transistor and the second transistor each including a drain electrode. The first parasitic capacitance electrode and the drain electrode of the first transistor forms a first capacitor, the second parasitic capacitance electrode and the drain electrode of the second transistor forms a second capacitor, and the second pixel has a larger area than the first pixel, and a capacitance of the second capacitor is configured to be different than a capacitance of the first capacitor.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and, together with the description, serve to explain principles of the inventive concept.

DETAILED DESCRIPTION OF THE ILLUSTRATED EMBODIMENTS

Figure 1:
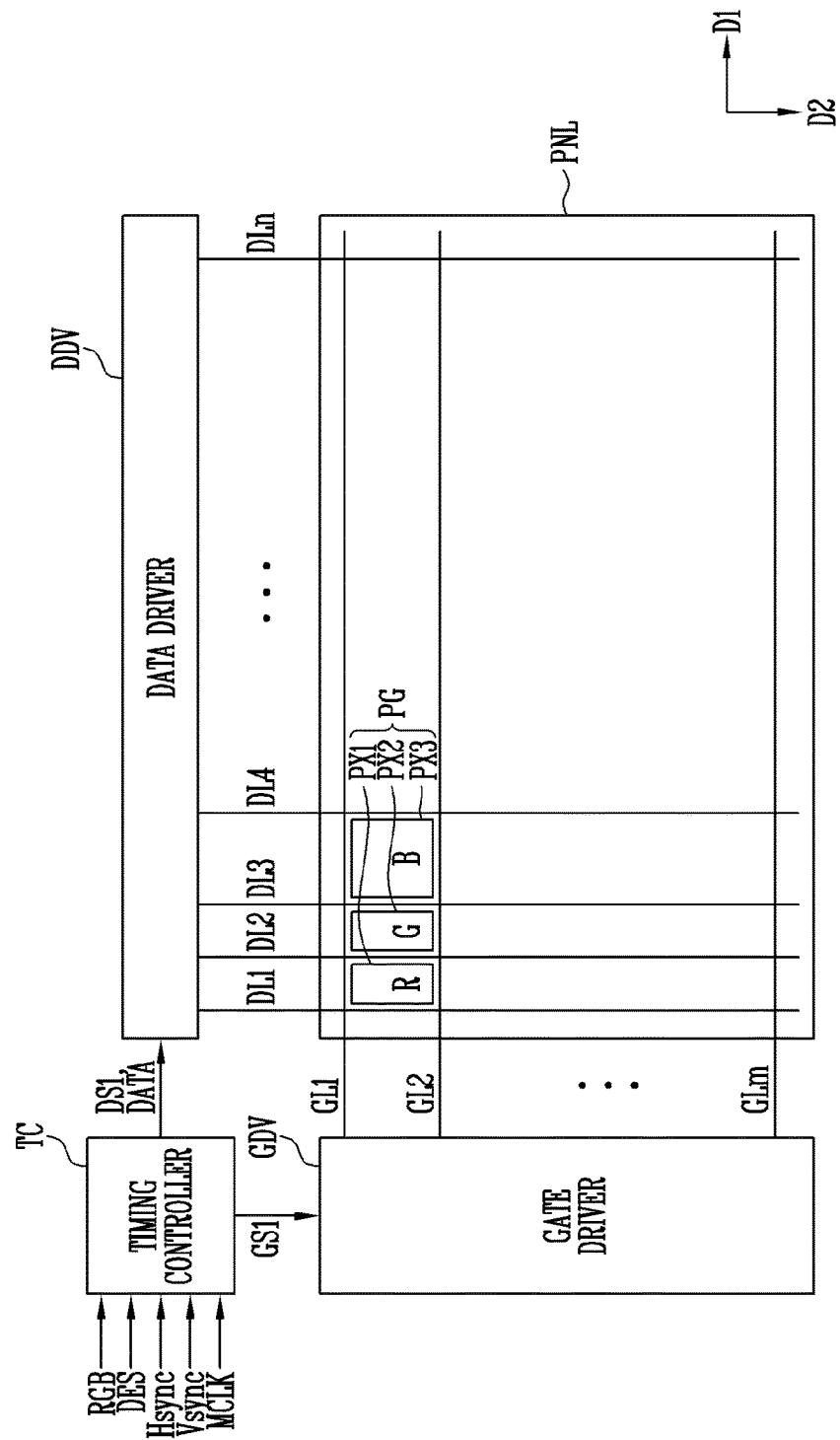
FIG. 1 is a schematic block diagram illustrating a display device according to an exemplary embodiment.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

FIG. 1 is a schematic block diagram illustrating a display device according to an exemplary embodiment.

Referring to FIG. 1, a display device according to an exemplary embodiment may include a display panel PNL, a timing controller TC, a gate driver GDV, and a data driver DDV.

The display panel PNL may be a liquid crystal panel including a first substrate, a second substrate, and a liquid crystal layer disposed between the first and second substrates.

The display panel PNL may include gate lines GL1 to GLm extending in a first direction D1 (e.g., in a row direction) and data lines DL1 to DLn extending in a second direction D2 crossing the first direction D1 (e.g., in a column direction). The display panel PNL may include a plurality of pixel groups PG. Each pixel group PG may include two or more pixels. For example, but without limitation thereto, each pixel group PG may include three or four pixels. The plurality of pixel groups PG may be arranged in the first direction D1 and the second direction D2. In an exemplary embodiment, each of the pixel groups PG may include three pixels, for example, but without limitation thereto, each of the pixel groups PG may include a first pixel PX1, a second pixel PX2 and a third pixel PX3. The first to third pixels PX1, PX2 and PX3 may be sequentially arranged in the first direction D1 as shown in FIG. 1. However, the first to third pixels PX1, PX2 and PX3 may be sequentially arranged in the second direction D2. In this configuration, gate lines GL1 to GLm may extend in the second direction D2 and the data lines DL1 to DLn may extend in the first direction D1. The first to third pixels PX1, PX2 and PX3 may each be coupled to the same gate line (e.g., the first to third pixels PX1, PX2 and PX3 may be coupled to the first gate line GL1) and be coupled to different data lines (i.e., to first to third data lines DL1, DL2 and DL3, respectively).

The first to third pixels PX1, PX2 and PX3 may include red, green, and blue color filters, respectively, to display red, green, and blue colors, respectively. However, it is not limited thereto, and the first to third pixels PX1, PX2 and PX3 may display various colors, such as white, yellow, cyan, magenta, etc.

The timing controller TC may receive image data RGB and a control signal from an external graphic controller (not shown). The image data RGB may include image data for red color R, image data for green color G, and image data for blue color B. The image data for red color R, the image data for green color G, and the image data for blue color B may include data correspond to the first pixel PX1, the second pixel PX2, and the third pixel PX3, respectively. The control signal may include vertical sync signal Vsync which is a frame distinguishing signal, a horizontal sync signal Hsync which is a row distinguishing signal, a data enable signal DES which is a high level only during a section where data is output to display an area where the data comes in, and a main clock signal MCLK.

The timing controller TC may change the image data RGB according to a specification of the data driver DDV and output the converted image data DATA to the data driver DDV. The timing controller TC may generate a gate control signal GS1 and a data control signal DS1 based on the control signal. The timing controller TC may output the gate control signal GS1 to the gate driver GDV and output the data control signal DS1 to the data driver DDV. The gate control signal GS1 may be a signal for driving the gate driver GDV, and the data control signal DS1 may be a signal for driving the data driver DDV.

The gate driver GDV may generate a gate signal for each of the gate lines GL1 to GLm based on the gate control signal GS1 and output the gate signals to the gate lines GL1 to GLm. The gate control signal GS1 may include at least one of a scan start signal instructing start of scanning, a clock signal which controls output cycle of a gate-on voltage and an output enable signal limiting duration time of a gate-on voltage, and the like.

The data driver DDV may generate gradation voltage for each of the data lines DL1 to DLn according to the input of the image data DATA based on the data control signal DS1 and output the generated gradation voltages to the data lines DL1 to DLn, respectively, as data voltage. The data voltage may include, with respect to common voltage, positive data voltage having a positive value and negative data voltage having a negative value. The data control signal DS1 may include a horizontal start signal STH signaling start of transmission of image data DATA to the data driver DDV, a load signal to signal for application of data voltage to the data lines DL1 to DLn, a reverse signal that reverses polarity of the data voltage with respect to the common voltage, and the like.

Each of the timing controller TC, the gate driver GDV, and the data driver DDV may be directly mounted on the display panel PNL as at least one integrated circuit chip form, mounted on a flexible printed circuit board and attached to the display panel PNL as a tape carrier package form, or additionally mounted on the printed circuit board. However, at least one of the gate driver GDV or the data driver DDV may be integrated on the display panel PNL along with the gate lines GL1 to GLm, the data lines DL1 to DLn, and the transistor. The timing controller TC, the gate driver GDV, and the data driver DDV may be integrated as a single chip.

Figure 2:
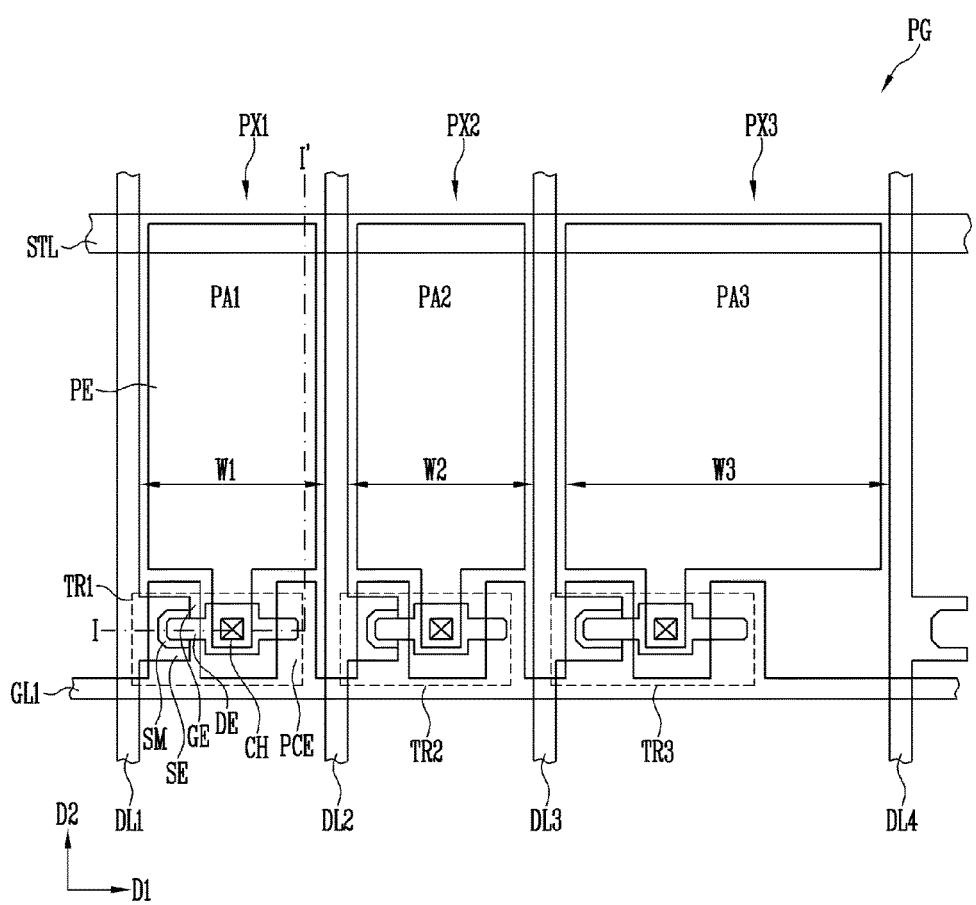
FIG. 2 is a plan view illustrating a display panel shown in FIG. 1 according to an exemplary embodiment.

FIG. 2 is a plan view illustrating the display panel shown in FIG. 1 according to an exemplary embodiment.

Referring to FIG. 2, a display device according to an exemplary embodiment may include a plurality of pixel groups PG displaying images. In FIG. 2, one of the plurality of pixel groups is illustrated as a representative example. The remaining pixel groups are not illustrated since they may have substantially the same structure as the one that is shown in FIG. 2.

The pixel group PG may be provided between 4 data lines sequentially arranged in the first direction D1 and between two adjacent gate lines. The sequentially arranged 4 data lines are referred to below as first to fourth data lines DL1, DL2, DL3, and DL4 and a gate line to which each pixel is coupled is referred to below as a first gate line GL1.

The pixel group PG may include first, second, and third pixels PX1, PX2, and PX3. The first to third pixels PX1, PX2, and PX3 may be provided, respectively, in first, second, and third pixel areas PA1, PA2, and PA3 sequentially arranged in the first direction D1. The first pixel area PA1 may be provided between first and second data lines DL1 and DL2, and the third pixel area PA3 may be provided between third and fourth data lines DL3 and DL4.

The first pixel PX1 may be coupled to a first transistor TR1. The first transistor TR1 may be coupled to the first gate line GL1 and the first data line DL1. The second pixel PX2 may be coupled to a second transistor TR2. The second transistor TR2 may be coupled to the first gate line GL1 and the second data line DL2. The third pixel PX3 may be coupled to a third transistor TR3. The third transistor TR3 may be coupled to the first gate line GL1 and the third data line DL3.

At least two pixel areas among the first pixel area PA1, the second pixel area PA2, and the third pixel area PA3 may have different horizontal widths in the first direction D1. The horizontal width may be defined as a distance from a data line provided on a side of an applicable pixel to a data line provided on the other side. For example, the horizontal width of the second pixel area PA2 is the distance between the second data line DL2 and the third data line DL3. The horizontal width of the first pixel PX1 may be defined as the distance from the first data line DL1 to the second data line DL2 along the first direction D1. Likewise, if the horizontal width of the first pixel PX1 is the first width W1, the horizontal width of the second pixel PX2 is the second width W2, and the horizontal width of the third pixel PX3 is the third width W3, each of the first to third widths W1, W2, and W3 may be different from each other. In an exemplary embodiment, two widths may be the same and the remaining width may be greater or smaller than the two widths. For example, but without limitation thereto, as shown in FIG. 2, the first width W1 and the second width W2 may be substantially the same, and the third width W3 may be greater than the first width W1 or the second width W2. In an exemplary embodiment, the third width W3 may be twice the first width W1 or the second width W2.

Each of the first pixel area PA1, the second pixel area PA2, and the third pixel area PA3 may have the same vertical width in the second direction D2. The vertical width may be defined as the distance from a gate line provided on a side of a corresponding pixel to a gate line provided on the other side of the corresponding pixel. However, in an exemplary embodiment, the first to third pixel areas PX1, PX2, and PX3 may have different vertical widths.

In an exemplary embodiment, a horizontal width and a vertical width of each pixel area may be configured differently from each other, unlike the examples described above. Areas of the first pixel area PA1, the second pixel area PA2 and the third pixel area PA3 may be different from each other, or two of the pixel areas PA1, PA2, and PA3 may have the same areas and the remaining pixel area may have an area that is greater or smaller than the areas of the two pixel areas.

In an exemplary embodiment, the first pixel PX1 may display a first color, for example, but without limitation thereto, red R, the second pixel PX2 may display a second color, for example, but without limitation thereto, green G, and the third pixel PX3 may display a third color, for example, but without limitation thereto, blue B. Colors displayed by the first to third pixels PX1, PX2, and PX3 may be different from the primary colors, red, green, and blue. At least one of the first to third pixels PX1, PX2, or PX3 may have a bigger size than the remaining pixels. For example, but without limitation thereto, in FIG. 1, the third pixel PX3 displaying blue is depicted as having a bigger size than the first and second pixels PX1 and PX2. However, the first pixel PX1 may have a bigger size than the second and third pixels PX2 and PX3, or the second pixel PX2 may have a bigger size than the first and third pixels PX1 and PX3.

Figure 3:
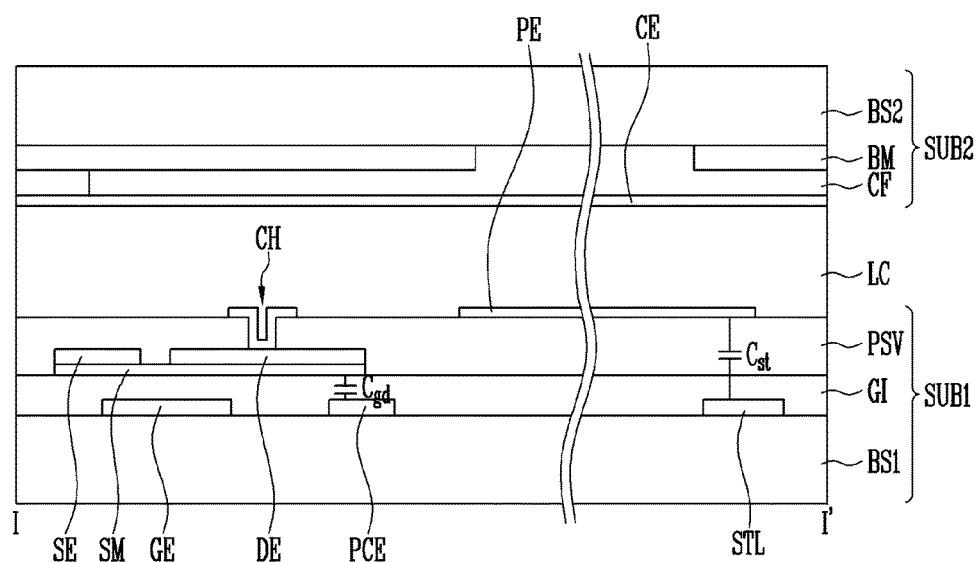
FIG. 3 is a cross-sectional view along section line I-I' shown in FIG. 2 according to an exemplary embodiment.

Hereinafter, referring to FIG. 2 and FIG. 3, the display panel PNL will be described mainly based on the first pixel PX1 along with a wire part, transistor, and the like. FIG. 3 is a cross sectional view along section line I-I' shown in FIG. 2 according to an exemplary embodiment. The first pixel to third pixel may have substantially the same structure except for size, and may be driven in substantially the same method. Thus, description for the second pixel PX2 and the third pixel PX3 may be omitted.

A display panel according to an exemplary embodiment may include a first substrate SUB1, a second substrate SUB2 facing the first substrate SUB1 and a liquid crystal layer LC disposed between the first substrate SUB1 and the second substrate SUB2.

The first substrate SUB1 may include a wire part provided on a first base substrate BS1, a first transistor TR1 coupled to the wire part, and a pixel electrode PE coupled to the first transistor TR1. The first transistor TR1 includes a gate electrode GE, a source electrode SE, a drain electrode DE, and a semiconductor pattern SM.

The first base substrate BS1 may have a generally quadrangle shape. The first base substrate BS1 may include or may be formed of a transparent insulating material.

The wire part may include a first gate line GL1, a parasitic capacitance electrode PCE, a first data line DL1, and a storage line STL.

The first gate line GL1 may be formed by extending on the first base substrate BS1 in the first direction D1.

The parasitic capacitance electrode PCE may protrude from the first gate line GL1 or be provided on a part of the first gate line GL1.

The storage line STL may be spaced part from the first gate line GL1 on the first base substrate BS1 and extend in the first direction D1. In an exemplary embodiment, the storage line STL is shown as extending only in a direction parallel to the first gate line GL1. However, the shape of the storage line STL is not limited thereto. The storage line STL may further include a projecting portion extending by protruding in the second direction D2 along data lines adjacent to each other in order to increase overlapping area with a pixel electrode PE.

A gate insulating layer GI may be provided on the first base substrate BS1 where the first gate line GL1 is formed. The gate insulating layer GI may include or may be made of an insulating material. For example, but without limitation thereto, the gate insulating layer GI may include silicon nitride or silicon oxide.

The first data line DL1 may be provided by extending in the second direction D2 crossing the first gate line GL1 extending in the first direction D1 and the gate insulating layer GI may be disposed between the first gate line GL1 and the first data line DL1.

The first transistor TR1 may be coupled to the first gate line GL1 and the first data line DL1. Referring to FIG. 1, for all pixels, the gate lines, the data lines and the transistors may be provided. Each of the transistors may be coupled to corresponding one of the plurality of gate lines and corresponding one of the plurality of data lines.

Referring to FIG. 2 and FIG. 3, the first transistor TR1 may include the gate electrode GE, the semiconductor pattern SM, the source electrode SE, and the drain electrode DE.

The gate electrode GE may protrude from the first gate line GL1 or be provided on a part of the first gate line GL1.

The gate electrode GE may include or may be made of a metal. The gate electrode GE may be made of nickel, chrome, molybdenum, aluminum, titanium, copper, tungsten, or alloy thereof. The gate electrode GE may be formed of a single layer or multi layers using one or more of the metals. For example, but without limitation thereto, the gate electrode GE may have triple layers with molybdenum, aluminum, and molybdenum sequentially stacked, double layers with titanium and copper sequentially stacked, or a single layer of an alloy of titanium and copper.

The semiconductor pattern SM may be provided on the gate insulating layer GI. The semiconductor layer SM may be provided on the gate electrode GE with a gate insulating layer GI interposed therebetween. A partial area of the semiconductor pattern SM may overlap the gate electrode GE. The semiconductor pattern SM may include or may be formed of amorphous silicon thin film or oxide semiconductor tin film.

The source electrode SE may be branched off from the data line DL. The source electrode SE may be disposed on the semiconductor pattern SM and a partial area of the source electrode SE may overlap the gate electrode GE.

The drain electrode DE is separated from the source electrode SE with the semiconductor pattern SM interposed therebetween. The drain electrode DE may be disposed on the semiconductor pattern SM and a partial area may overlap the gate electrode GE. The drain electrode may extend in a direction (for example, but without limitation thereto, a first direction D1), and a portion of the drain electrode DE may overlap the parasitic capacitance electrode PCE with the gate insulating layer GI interposed therebetween. The drain electrode DE, the parasitic capacitance electrode PCE, and the gate insulating layer GI may form a parasitic capacitor Cgd.

The source electrode SE and the drain electrode DE may include or may be formed of an alloy including nickel, chrome, molybdenum, aluminum, titanium, copper, tungsten, and a mixture thereof. The source electrode SE and the drain electrode DE may include a single layer or multi layers using at least one of the metals. For example, but without limitation thereto, the source electrode SE and the drain electrode DE may be double layers with titanium and copper sequentially stacked, or a single layer formed of an alloy of titanium and copper.

The source electrode SE and the drain electrode DE are distanced apart from each other, and a top surface of the semiconductor pattern SM between the source electrode SE and the drain electrode may be exposed. The semiconductor pattern SM between the source electrode SE and the drain electrode DE may be a channel portion CHN forming a conductive channel between the source electrode SE and the drain electrode DE depending on an applied voltage of the gate electrode GE.

A protective layer PSV may be disposed on the source electrode SE and the drain electrode DE. The protective layer PSV may include, for example, but without limitation thereto, silicon nitride or silicon oxide.

A contact hole CH may be formed in the protective layer PSV exposing a part of the top surface of the drain electrode DE.

The pixel electrode PE may be disposed on the protective layer PSV and may be coupled to the drain electrode DE through the contact hole CH.

The pixel electrode PE may generally have a rectangular shape when viewed from a plan view, but the shape is not limited thereto. The pixel electrode PE may include various shapes depending on a shape of each pixel PXL. A slit or protrusion may be provided in the pixel electrode PE.

The pixel electrode PE may include or may be formed of a transparent conductive material. For example, the pixel electrode PE may be formed of a transparent conductive oxide. The transparent conductive oxide may be indium tin oxide (ITO), indium zinc oxide (IZO), indium tin zinc oxide (ITZO), and the like.

The pixel electrode PE may overlap the storage line STL with the gate insulating layer GI and the protective layer PSV interposed therebetween, and the pixel electrode PE and the storage line STL may form a storage capacitor Cst.

The second substrate SUB2 may be provided such that the second substrate SUB2 faces the first substrate SUB1. The second substrate SUB2 may include a second base substrate BS2, a color filter CF, a black matrix BM, and a common electrode CD.

The color filter CF and the black matrix BM may be disposed on the second base substrate BS2. The common electrode CE may be disposed on the color filters CF and the black matrix BM.

Each color filter CF may display one of red, green, and blue colors. Further, various colors such as white, yellow, cyan and magenta may be displayed by having one or more color filters CF other than color filters for red, green, and blue colors.

The black matrix BM may be formed between the color filters CF and block light that passes through the liquid crystal layer LC between adjacent pixels. In FIG. 3, the color filter CF is shown as being provided on the second substrate SUB2, but it is not limited thereto. In another exemplary embodiment, it may be provided on the first substrate SUB1.

The common electrode CE may be provided on the color filters CF and the black matrix BM. Although it is not shown, a slit or protrusion may be provided in the common electrode CE.

In an exemplary embodiment, the display device may be driven in a twisted nematic mode or a vertical alignment mode.

In an exemplary embodiment, the pixel electrode PE, the common electrode CE, and the liquid crystal layer LC may constitute the first pixel PX1. The first pixel PX1 may be driven by the first transistor TR1. When the transistor TR1 is turned on in response to a gate signal provided through the first gate line GL1, data voltage provided through the first data line DL1 may be provided to the pixel electrode PE through the turned on transistor TR1. Accordingly, an electric field may be formed between the pixel electrode PE and the common electrode CE to which common voltage is applied. Liquid crystal molecules of the liquid crystal layer LC may be driven depending on the electric field, and as a result, an image is displayed depending on the amount of light passing through the liquid crystal layer LC.

In an exemplary embodiment, the size of the first transistor TR1 coupled to the first pixel PX1 may be the same as the size of the second transistor TR2 coupled to the second pixel PX2, and the size of the third transistor TR3 coupled to the third pixel PX3 may be different from the sizes of the first and second transistors TR1 and TR2. The first transistor TR1 and the second transistor TR2 may be formed in substantially same shape and same size. Therefore, except for the second transistor TR2, the first transistor TR1 and the third transistor TR3 may be compared. In a case in which the size of the first transistor TR1 and the size of the second transistor TR2 are different, the description between the first transistor TR1 and the third transistor TR3 below may be applicable to the difference between the first transistor TR1 and the second transistor TR2.

Figure 4A:
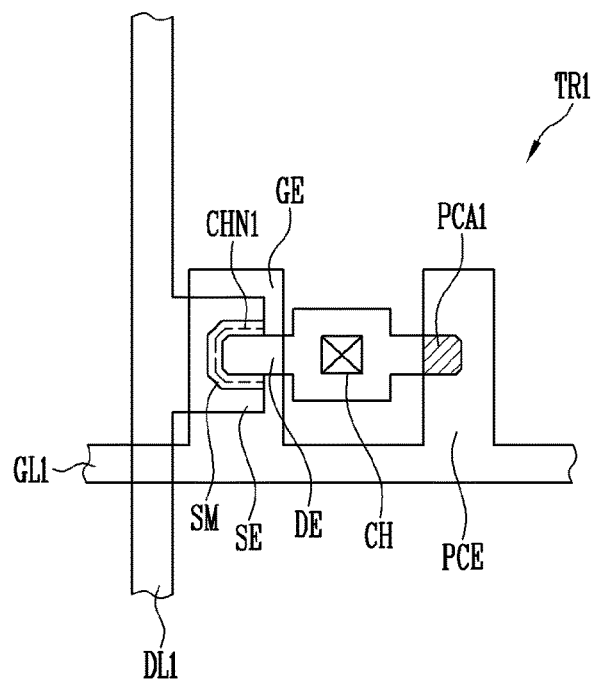
FIG. 4A and FIG. 4B are plan views schematically illustrating each of first transistor and third transistor shown in FIG. 2 according to an exemplary embodiment.
Figure 4B:
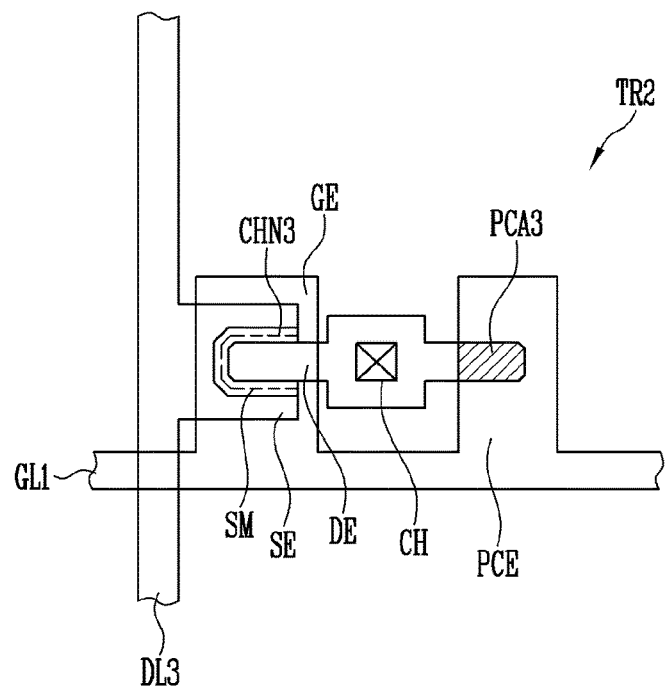

Referring to FIG. 2, FIG. 4A, and FIG. 4B, a channel length CHN1 of the first transistor TR1 may be shorter than a channel length CHN3 of the third transistor TR3. This is to secure charge capacity according to a difference in areas of the first pixel area PA1 and the third pixel area PA3. The channel length CHN3 of the third transistor TR3 coupled to the third pixel PX3, whose pixel area is the greatest, may be formed to be the longest.

The area of a drain electrode DE of the first transistor TR1 may be smaller than an area of a drain electrode DE of the third transistor TR3. A part of the drain electrode DE may overlap the parasitic capacitance electrode PCE with the gate insulating layer GI interposed therebetween. Depending on a difference in area of the drain electrode DE, overlapping areas of the parasitic capacitance electrode PCE and the drain electrode DE may also be different. The drain electrode DE of the third transistor TR3 and an overlapping area PCA3 of the parasitic capacitance electrode PCE may be greater than the drain electrode DE of the first transistor TR1 and the overlapping area PCA1 of the parasitic capacitance electrode PCE. As a result, the parasitic capacitance Cgd in the third pixel PX3 may be greater than the parasitic capacitance Cgd in the first pixel PX1. The difference in the parasitic capacitance Cgd between the first and third pixels PX1 and PX3 reduces the difference in a kick back voltage in the charge capacity between the first transistor TR1 and the third transistor TR3.

From the mathematical formula I shown below, the kick back voltage ($\Delta Vk$) is inversely proportional to the size of a storage capacitor Cst and a liquid crystal capacitor Clc. Therefore, if sizes of pixel electrodes are different between the pixels, there occurs a deviation in the kick back voltage ($\Delta Vk$) between the pixels. More specifically, due to the difference between the pixel electrode and the storage capacitor Cst according to overlapping area of the storage line and a difference between the pixel electrode and the liquid crystal capacitor Clc according to overlapping area of the common electrode, there occurs a deviation in a kick back voltage between the pixels.

$$\Delta Vk = \frac{Cgd}{Clc + Cst + Cgd} \times \Delta Vg \qquad < \text{Mathematical Formula I} >$$

Here, Clc refers to a capacity of the liquid crystal capacitor, Cst refers to a capacity of the storage capacitor, Cgd refers to a parasitic capacity between the gate electrode and the drain electrode, and ΔVg refers to a difference in the gate-on voltage and the gate-off voltage applied to the gate electrode.

According to the mathematical formula I, the kick back voltage Vkb may be affected by the parasitic capacitance of a corresponding transistor provided in a pixel. A deviation may occur due to the difference in sizes of pixel electrodes. For example, but without limitation thereto, kick back voltage may be smaller in the third pixel of which size of pixel electrode is relatively large than the first pixel and the second pixel of which sizes of pixel areas are relatively small. Accordingly, a difference may present in charge rate for each pixel, which deteriorates image quality.

In an exemplary embodiment, by adjusting the parasitic capacitance Cgd between a gate electrode and a drain electrode of a transistor, the deviation of kick back voltage (ΔVk) of each pixel may be reduced. More specifically, the parasitic capacitance Cgd between the gate electrode and the drain electrode may be adjusted by adjusting the overlapping area between the parasitic capacitance electrode and the drain electrode. For example, but without limitation thereto, in the case where the first pixel and the second pixel of which sizes of pixel areas are relatively smaller than the size of the third pixel, the transistors of the first and second pixels may be adjusted to have a smaller overlapping area between the parasitic capacitance electrode and the drain electrode of the first pixel or the second pixel. Further, since the third pixel has a size of pixel area relatively larger than those of the first and second pixels, the third pixel may be configured to have a larger overlapping area between the parasitic capacitance electrode and the drain electrode of the third pixel. According to the mathematical formula I, since the kick back voltage Vkb is affected by the parasitic capacitance Cgd of the corresponding transistor provided in a pixel, the deviation of the kick back voltage (Vk) due to the difference in sizes of the pixel electrodes may be compensated by differing the size of each transistor provided in the pixels. Accordingly, an image quality may be improved by reducing kick back voltage (Vk) differences among transistors TR1, TR2, and TR3.

In an exemplary embodiment, each pixel group is not limited to the above described structure. The deviation of the kick back voltage in the pixels having different areas and the resulting different charge capacities may be made large, and due to this structure, transistors having different parasitic capacitance may be applied.

Figure 5:
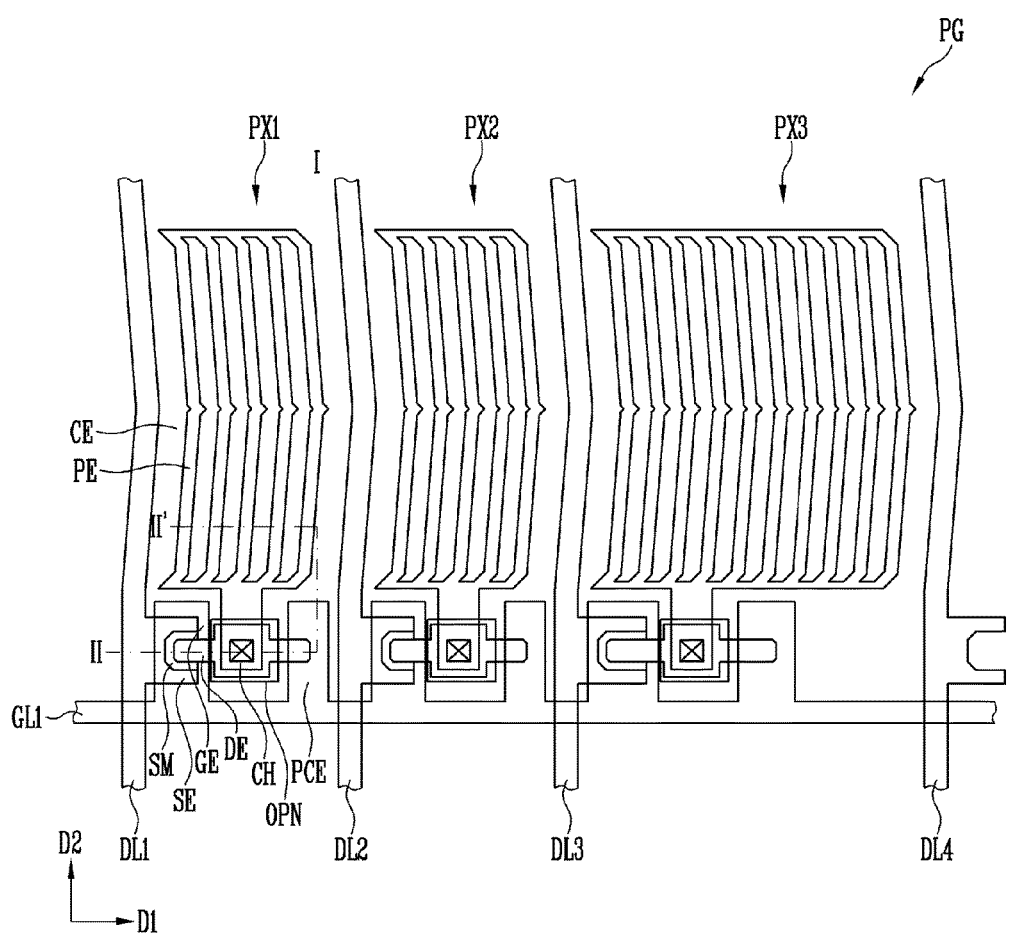
FIG. 5 is a plan view illustrating pixel group according to an exemplary embodiment.
Figure 6:
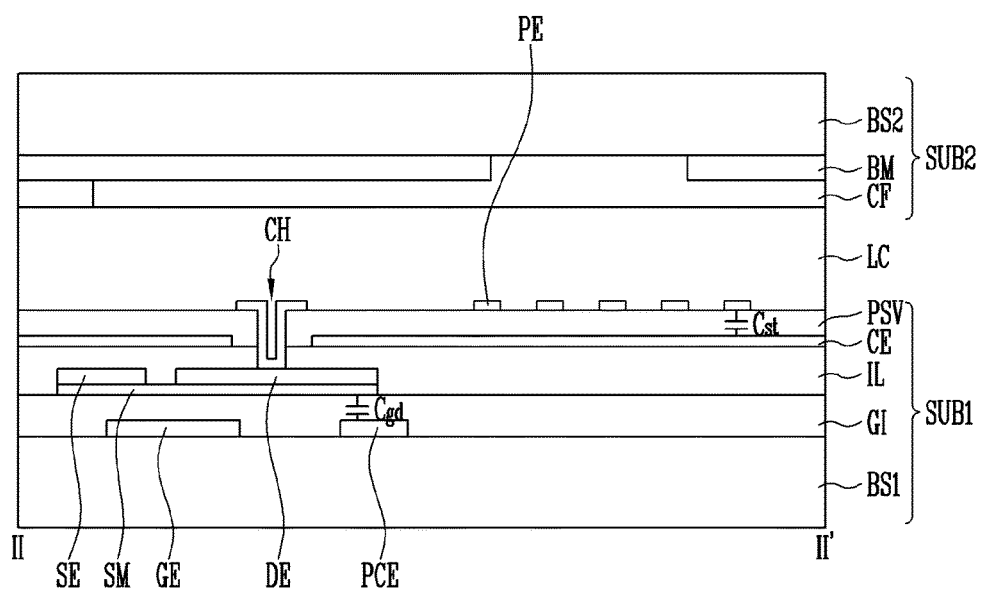
FIG. 6 is a cross-sectional view along section line II-IF shown in FIG. 5 according to an exemplary embodiment.

FIG. 5 is a plan view showing a pixel group according to an exemplary embodiment, and FIG. 6 is a cross sectional view along section line II-II' shown in FIG. 5 according to an exemplary embodiment. In an exemplary embodiment, in order to avoid repetitive description, a description will be made based mainly on differences from the illustrated embodiments of FIG. 2, FIG. 3, FIG. 4A, and FIG. 4B will be provided.

Referring to FIG. 5 and FIG. 6, the display device may include a first base substrate SUB1, a second substrate SUB2 facing the first substrate SUB1, and a liquid crystal layer LC disposed between the first substrate SUB1 and the second substrate SUB2.

The first substrate SUB1 may include a wire part provided on the first base substrate BS1, a first transistor TR1 coupled to the wire part, a pixel electrode PE coupled to the first transistor TR1 and a common electrode CE distanced apart and insulated from the pixel electrode PE.

The wire part may include a first gate line GL1, a parasitic capacitance electrode PCE, and a first data line DL1.

The first gate line GL1 may be formed by extending in a first direction D1 on the first base substrate BS1.

The parasitic capacitance electrode PCE may be protruded from the first gate line GL1 or be provided on a part of the first gate line GL1.

The first data line DL1 may extend in a second direction D2 crossing the first gate line GL1. The first data line DL1 and the first gate line GL1 have the gate insulating layer GI therebetween.

The first transistor TR1 may be coupled to the first gate line GL1 and the first data line DL1. Referring to FIG. 1, a number of gate lines, data lines and transistors may be provided for multiple pixels. Each transistor may be coupled to a corresponding one of the plurality of gate lines and a corresponding one of the plurality of data lines. The first transistor TR1 may include a gate electrode GE, a parasitic capacitance electrode PCE, a semiconductor pattern SM, a source electrode SE, and a drain electrode DE.

An interlayer layer IL may be disposed on the source electrode SE and the drain electrode DE. The interlayer layer IL may include or may be made of an insulative material, for example, but without limitation thereto, silicon nitride or silicon oxide.

A protective layer PSV may be provided on the interlayer layer IL. The protective layer PSV may include, for example, but without limitation thereto, silicon nitride or silicon oxide.

A contact hole CH exposing a part of the top surface of the drain electrode DE may be formed in the interlayer layer IL and the protective layer PSV.

The pixel electrode PE may be provided on the protective layer PSV and may be coupled to the drain electrode DE through the contact hole CH. The pixel electrode PE may have a plurality of branches. The branches may be distanced apart from each other at regular intervals and may form an electric field with the common electrode CE. The shapes of the branches are not limited thereto, and they may be provided in various shapes.

The common electrode CE may be provided between the interlayer layer IL and the protective layer PSV. The common electrode CE may be formed as a whole plate to cover almost all of the pixel areas. The shape of the common electrode CE is not limited to a rectangle, and may have different shapes, e.g., a different polygonal shape, or a plate having a slit pattern, branches, and the like. If the same common voltage is applied by being coupled at the pixel areas that are adjacent to each other, it may be provided in different shapes. In an area where the contact hole CH is provided, there may be an opening OPN from which the common electrode CE is removed (see e.g., FIG. 6). The common electrode CE and the pixel electrode PE may be insulated from each other by having the protective layer PSV therebetween. The common electrode CE, pixel electrode PE, and the protective layer PSV may form a storage capacitor Cst of each pixel.

The second substrate SUB2 may face the first substrate SUB1. The second substrate SUB2 may include a second base substrate BS2, a color filter CF, and a black matrix BM.

In an exemplary embodiment, the common electrode CE may be a whole plate, the pixel electrode PE may have branches, and the display device may be driven in a plane-to-line switching (PLS) mode. However, the shape of the pixel electrode PE, the shape of the common electrode CE and the driving mode thereof are not limited thereto. For example, but without limitation thereto, there may be a plurality of branches formed at the common electrode CE. The branches of the pixel electrode PE may be alternately arranged with branches of the common electrode on a plane and may be driven in an in-plane-switching (IPS) mode. Further, the structure of the display device may have other modes besides the PLS mode or IPS mode if the modes are suitable in implementing the features described herein.

Referring to FIG. 5, similar to the pixels shown in FIG. 2, the area of the drain electrode DE of the first transistor TR1 may be smaller than an area of the drain electrode DE of the third transistor TR3. A part of the drain electrode DE may overlap the parasitic capacitance electrode PCE with the gate insulating layer GI interposed therebetween. Depending on the difference in area of the drain electrode DE, there may be a difference in overlapping area with the parasitic capacitance electrode PCE as well. The overlapping area of the drain electrode DE of the third transistor TR3 and the parasitic capacitance electrode PCE of the first pixel PX1 may be larger than the overlapping area of the drain electrode DE of the first transistor TR1 and the parasitic capacitance electrode PCE of the third pixel PX3. As a result, the parasitic capacitance Cgd in the third pixel PX3 may be greater than the parasitic capacitance Cgd in the first pixel PX1. In an exemplary embodiment, the difference in the parasitic capacitance Cgd in the first and third pixels PX1 and PX3 may reduce the deviation of the kick back voltage in the charge capacity of the first and third pixels PX1 and PX3.

Table 1 shows simulation results showing the difference in data voltage of the first pixel and the third pixel after kick back in a conventional display device and a display device according to an exemplary embodiment. The exemplary embodiment shows the difference in data voltage between the first pixel and the third pixel in the structure shown in FIG. 5. The comparative example shows the difference in data voltage between the first pixel and the third pixel in a case where there is no difference in capacity of parasitic capacitor for each pixel while everything else besides the parasitic capacitor is the same as the structure shown in FIG. 5.

The channel length of the first pixel PX1 is set to 18 μm and the channel length of the third pixel is set to 32 μm in both the comparative example and the exemplary embodiment. These are set values to satisfy 99% charge rate for both first and third pixels. The positions in Table 1 below show measured positions of the data voltage. It represents the center position of each area when the display panel is divided into nine sections after the rectangular display panel of a preset size is manufactured.

TABLE 1

| Data voltage measurement position | Comparative example (mV) | Exemplary Embodiment (mV) |
|---|---|---|
| Upper left | 48.1 | 11.7 |
| Middle left | 48.1 | 11.7 |
| Lower left | 47.8 | 11.7 |
| Upper middle | 49.4 | 15.9 |
| Center | 49.4 | 15.8 |
| Lower middle | 49.1 | 16.0 |
| Upper right | 49.7 | 15.1 |
| Middle right | 49.7 | 15.0 |
| Lower right | 49.3 | 15.6 |

Referring to Table 1, in the case of the comparative example, the difference in data voltage between the first pixel and the third pixel after kick back is 47.8 mV to 49.7 mV. However, in the case of exemplary embodiment of FIG. 5, the difference in data voltage between the first pixel PX1 and the third pixel PX3 after kick back is 11.7 mV to 16.0 mV, which is very small value compared to the comparative example. Accordingly, if the parasitic capacitance of the first pixel and the third pixel changes, it is confirmed that the kick back voltage deviation between the first and third pixels which have different sizes of areas becomes significantly small and the image quality is enhanced.

In the exemplary embodiments, the first pixel and the second pixel are illustrated as having the same size of areas in one pixel group and the third pixel is illustrated as having a greater size of area than the sizes of the first and second pixels. However, it is not limited thereto. For example, but without limitation thereto, the display device may have two or more pixel groups.

Figure 7:
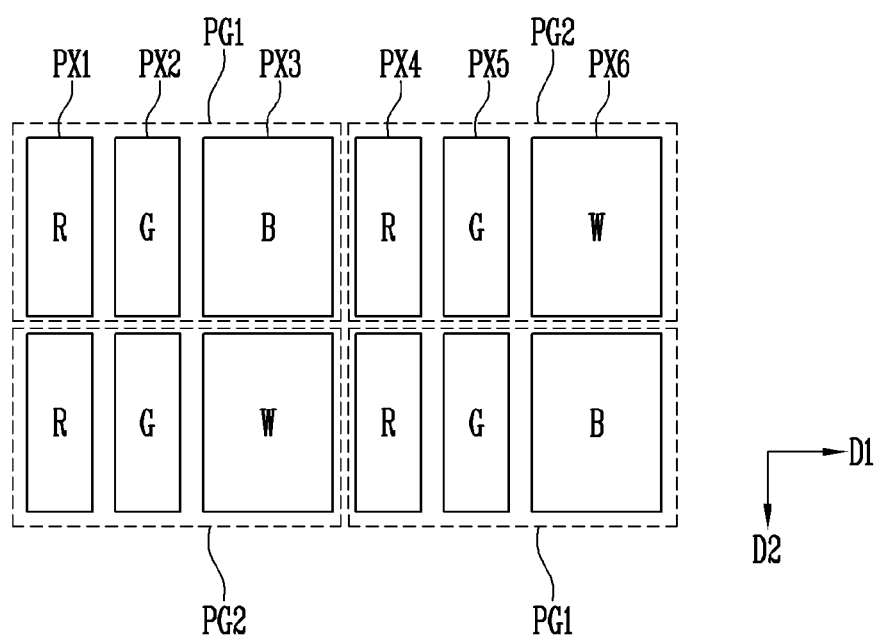
FIG. 7 is a plan view illustrating a display device including two pixel groups according to an exemplary embodiment.

FIG. 7 is a plan view illustrating a display device including two pixel groups according to an exemplary embodiment.

Referring to FIG. 7, the display device according to an exemplary embodiment may include first and second pixel groups PG1 and PG2. The first pixel group PG1 may include first to third pixels PX1, PX2, and PX3, and the second pixel group PG2 may include fourth to sixth pixels PX4, PX5, and PX6. The first and second pixel groups PG1 and PG2 may be alternately arranged in a first direction D1 and a second direction D2. Further, although not illustrated, more than two pixel groups may be alternately arrange in the first direction D1 and the second direction D2.

The first to third pixels PX1, PX2, and PX3 in the first pixel group GP1 may be sequentially arranged in the first direction D1. At least one of the first to third pixels PX1, PX2, and PX3 may have a size that is bigger than the remaining pixels. For example, but without limitation thereto, the first pixel PX1 may display a first color, for example but without limitation thereto, red R, the second pixel PX2 may display a second color, for example but without limitation thereto, green G, and the third pixel PX3 may display a third color, for example but without limitation thereto, blue B. In FIG. 7, the third pixel PX3 display blue B is illustrated as having a structure which has bigger size than the first and second pixels PX1 and PX2, but the exemplary embodiment is not limited thereto.

Fourth to sixth pixels PX4, PX5, and PX6 in the second pixel group PG2 may be sequentially arranged in the first direction D1, and at least one of the fourth to sixth pixels PX4, PX5, and PX6 may have a bigger size than the sizes of the remaining pixels in the second pixel group PG2. For example, but without limitation thereto, the fourth pixel PX4 may display a fourth color, for example but without limitation thereto, red R, the fifth pixel PX5 may display a fifth color, for example but without limitation thereto, green G, and the sixth pixel PX6 may display a sixth color, for example but without limitation thereto white W. In FIG. 7, the sixth pixel PX6 displaying white W is illustrated as having a pixel structure which has a bigger size than the sizes of the fourth and fifth pixels PX4 and PX5, but it is not limited thereto.

The first and second pixel groups PG1 and PG2 may have substantially the same pixel structures but the only difference may be displaying colors. Therefore, since the pixel structures with respect to the first and second pixel groups PG1 and PG2 are substantially the same except the pixel colors, the description provided with reference to FIG. 2 and FIG. 4 and other Figures are applicable to both the first and second pixel groups PG1 and PG2 except the colors of the color filters. Thus, the same description regarding the first and second pixel groups PG1 and PG2 with respect to FIG. 7 is omitted.

As described above, by adjusting the parasitic capacitance between the parasitic capacitance electrode, which may be protruded from a gate line, and the drain electrode, deviation in kickback voltage of each pixel may be reduced, thereby improving image quality.

Although certain exemplary embodiments and implementations have been described herein, other embodiments and modifications will be apparent from this description. Accordingly, the inventive concept is not limited to such embodiments, but rather to the broader scope of the presented claims and various obvious modifications and equivalent arrangements.

What is claimed is:

1. A display device comprising:
    a first base substrate;
    gate lines disposed on the first base substrate, the gate lines extending in a first direction;
    parasitic capacitance electrodes coupled to the gate lines;
    data lines extending in a second direction crossing the first direction;
    transistors, each coupled to one of the gate lines and coupled to one of the data lines; and
    pixels sequentially arranged in the first direction, each of the pixels coupled to a corresponding one of the transistors, respectively,
    wherein each of the transistors comprises a gate electrode, a source electrode, and a drain electrode, and
    wherein widths of the parasitic capacitance electrodes in adjacent pixels measured along the first direction are different from each other.

2. The display device as claimed in claim 1, wherein at least two pixels among the pixels have different pixel sizes.

3. The display device as claimed in claim 2,
    wherein the data lines comprise a first data line, a second data line, a third data line, and a fourth data line sequentially arranged along the first direction,
    wherein a first pixel among the pixels has a first width along the first direction between the first data line and the second data line, a second pixel among the pixels has a second width along the first direction between the second data line and the third data line, and a third pixel among the pixels has a third width along the first direction between the third data line and the fourth data line, and
    wherein one of the first width, the second width, and the third width is larger than the remaining two widths.

4. The display device as claimed in claim 3, wherein:
    the transistors comprise a first transistor corresponding to the first pixel, a second transistor corresponding to the second pixel, and a third transistor corresponding to the third pixel;
    an overlapping area between the drain electrode of the first transistor and a first one of the parasitic capacitance electrodes is a first area, an overlapping area between the drain electrode of the second transistor and a second one of the parasitic capacitance electrodes is a second area, and an overlapping area between the drain electrode of the third transistor and a third one of the parasitic capacitance electrodes is a third area; and
    one of the first area, the second area, and the third area is larger than the remaining two areas.

5. The display device as claimed in claim 4, wherein the first width and the second width are the same, and the third width is larger than the first width.

6. The display device as claimed in claim 5, wherein the first area and the second area are the same size, and the third area is larger than the first area.

7. The display device as claimed in claim 6, wherein the first pixel, the second pixel, and the third pixel are configured to display a different one of a first color, a second color, and a third color, respectively, the first, second, and third colors being different colors from each other.

8. The display device as claimed in claim 7, wherein the first color corresponds to red, the second color corresponds to green, and the third color corresponds to blue.

9. The display device as claimed in claim 8, wherein the first pixel is configured to display one of red and green, the second pixel is configured to display the remaining one of the red and green, and the third pixel is configured to display blue.

10. The display device as claimed in claim 1, wherein each of the pixels comprises:
    a pixel electrode, coupled to the drain electrode of the corresponding one of the transistors;
    a common electrode spaced apart from the pixel electrodes of the pixels and forming an electric field together with the pixel electrodes of the pixels; and
    a liquid crystal layer configured to be driven by the electric field.

11. The display device as claimed in claim 10, further comprising a second base substrate facing the first base substrate,
    wherein the pixel electrodes of the pixels are disposed on the first base substrate, the common electrode is disposed on the second base substrate, and the liquid crystal layer is disposed between the first base substrate and the second base substrate.

12. The display device as claimed in claim 10, further comprising a second base substrate facing the first base substrate,
    wherein the pixel electrodes of the pixels and the common electrode are disposed on the first base substrate, and the liquid crystal layer is disposed between the first base substrate and the second base substrate.

13. The display device as claimed in claim 12, wherein each of the pixel electrodes comprises first branches, the common electrode comprises second branches, and the first branches and the second branches are alternately arranged in a plan view.

14. The display device as claimed in claim 12, wherein the pixel electrodes of the pixels comprise branches, the common electrode has a whole plate shape, and the branches overlap the common electrode as viewed from a plan view.

15. The display device as claimed in claim 1, wherein the transistors comprise a first, second, and third transistors, the pixels comprise a first, second, and third pixels, and the display device further comprising:
    a fourth, fifth, and sixth transistors, each of the fourth, fifth, and sixth transistors coupled to one of the gate lines and one of the data lines; and
    a fourth, fifth, and sixth pixels sequentially arranged in the first direction, each of the fourth, fifth, and sixth pixels coupled to the fourth, fifth, and sixth transistors, respectively,
    wherein each of the fourth, fifth, and sixth transistors comprises a gate electrode, a source electrode, and a drain electrode, and at least two drain electrodes among the drain electrodes of the fourth, fifth, and sixth transistors overlap a corresponding one of the parasitic capacitance electrodes in different areas as viewed from a plan view.

16. The display device as claimed in claim 15, wherein the first, second, and third pixels display a first, second, and third colors, respectively, wherein each of the first, second, and third colors is one of red, green, and blue, respectively.

17. The display device as claimed in claim 16,
wherein the fourth, fifth, and sixth pixels display a fourth, fifth, and sixth colors, respectively,
wherein each of the fourth, fifth, and sixth colors is one of red, green, and white, respectively.

18. The display device as claimed in claim 17, wherein the first, second, and third pixels form a first pixel group and the fourth, fifth, and sixth pixels form a second pixel group, the first and second pixel groups being alternately arranged in the first direction and the second direction.

19. A display device comprising:
a first base substrate;
gate lines disposed on the first base substrate, the gate lines extending in a first direction;
parasitic capacitance electrodes protruding from the gate lines;
data lines extending in a second direction crossing the first direction;
a first transistor and a second transistor, each of the first transistor and the second transistor is coupled to one of the gate lines and one of the data lines; and
a first pixel and a second pixel sequentially arranged in the first direction, the first pixel being coupled to the first transistor and the second pixel being coupled to the second transistor,
wherein each of the first transistor and the second transistor comprises a gate electrode, a source electrode, and a drain electrode, and
wherein a first overlapping area between the drain electrode of the first transistor and the parasitic capacitance electrode in the first pixel and a second overlapping area between the drain electrode of the second transistor and the parasitic capacitance electrode in the second pixel have different sizes from each other to have different capacitances from each other as viewed from a plan view.

20. A display device comprising:
a first base substrate;
a gate line disposed on the first base substrate, the gate line extending in a first direction;
a first parasitic capacitance electrode and a second parasitic capacitance electrode coupled to the gate line;
a first data line and a second data line extending in a second direction crossing the first direction; and
a first transistor corresponding to a first pixel of a pixel group, and a second transistor corresponding to a second pixel of the pixel group, the first transistor and the second transistor each comprising a drain electrode,
wherein the first parasitic capacitance electrode and the drain electrode of the first transistor forms a first capacitor,
wherein the second parasitic capacitance electrode and the drain electrode of the second transistor forms a second capacitor, and
wherein the second pixel has a larger area than the first pixel, and a capacitance of the second capacitor is configured to be different than a capacitance of the first capacitor.

* * * * *